United States Patent [19]

Bayerer et al.

[11] Patent Number: 5,574,312

[45] Date of Patent: Nov. 12, 1996

[54] LOW-INDUCTANCE POWER SEMICONDUCTOR MODULE

[75] Inventors: Reinhold Bayerer, Reichelsheim, Germany; Thomas Stockmeier, Rancho Palos Verdes, Calif.

[73] Assignee: ABB Management AG, Baden, Switzerland

[21] Appl. No.: 435,617

[22] Filed: May 5, 1995

[30] Foreign Application Priority Data

Jun. 17, 1994 [DE] Germany ............... 44 21 319.0

[51] Int. Cl.$^6$ ............... H01L 23/10; H01L 23/34
[52] U.S. Cl. ............... 257/706; 257/707; 257/705; 257/723
[58] Field of Search ............... 257/714, 715, 257/716, 718, 719, 706, 707, 705, 723, 724, 691, 712

[56] References Cited

U.S. PATENT DOCUMENTS

| | | | |
|---|---|---|---|
| 4,126,883 | 11/1978 | Martin | 257/718 |
| 5,408,128 | 4/1995 | Furnival | 257/724 |
| 5,444,295 | 8/1995 | Lake et al. | 257/724 |

FOREIGN PATENT DOCUMENTS

| | | |
|---|---|---|
| 0424858A2 | 5/1991 | European Pat. Off. . |
| 3931634A1 | 4/1991 | Germany . |
| 3937045A1 | 5/1991 | Germany . |
| 9113499U1 | 6/1992 | Germany . |
| 4103486A1 | 8/1992 | Germany . |
| 4234506A1 | 4/1993 | Germany . |
| 4217289A1 | 12/1993 | Germany . |
| 4330070A1 | 3/1994 | Germany . |
| 4402425A1 | 8/1994 | Germany . |

OTHER PUBLICATIONS

Japanese Abstract JP 5–198964(A); E–1462, Nov. 19, 1993, vol. 7, No. 629, "Power Supply Apparatus".

Primary Examiner—Jerome Jackson
Assistant Examiner—S. V. Clark
Attorney, Agent, or Firm—Oblon, Spivak, McClelland, Maier & Neustadt, P.C.

[57] ABSTRACT

In the case of a power semiconductor module (1) according to the invention, substrates (8) having a power semiconductor assembly (2) are fitted on both sides of a heat sink (3). The power semiconductor assemblies (2) are made contact with by a stack of contact laminates (4), which contact laminates (4) run parallel to the heat sink (3). A very low-inductance structure is obtained thereby.

19 Claims, 1 Drawing Sheet

LOW-INDUCTANCE POWER SEMICONDUCTOR MODULE

BACKGROUND OF THE INVENTION

1. Field of the Invention

The invention relates to the field of power semiconductor electronics.

It is based on a power semiconductor module according to the preamble of the first claim.

2. Discussion of Background

Such a power semiconductor module has already been described in German Offenlegungsschrift 39 37 045 A1.

A power semiconductor module generally comprises a plurality of semiconductor components, which can be combined to form a logical functional unit. Examples are rectifiers, individual switches having a reverse-connected parallel diode, or phase modules. Modules differ from the disk-type thyristors which are customary nowadays in the area of high power semiconductors essentially by the fact that the cooling and the power connections are electrically insulated from one another.

Such modules (thyristor, transistor, IGBT, MOSFET and diode modules) are widespread nowadays in the power range up to 1200 V and a few hundred A and are used primarily in industrial drives. Modules for high currents generally comprise a number of individual modules, which are connected in parallel in the module, or a plurality of modules are connected in parallel in the same way.

At present, there are upper limits to the performance of the modules in respect of current-carrying capacity and maximum blocking voltage as a result of the following problems:

The parasitic inductance of the internal structure of a module does not permit an arbitrary number of components to be connected in parallel. Turn-on and turn-off operations would lead to impermissible oscillations. In addition, the area of the individual components connected in parallel cannot be increased arbitrarily, for reasons of production costs and reliability.

As the base area of the module increases, the reliability problems are exacerbated, especially in respect of the resistance, to be required, to temperature change, since the mechanical loading becomes larger and larger as the physical size increases and as a result of the different thermal expansion coefficients of the materials used.

The creepage paths which can be achieved with a conventional module are generally too small for the insulation strength required for components which have a high blocking strength.

The thermal resistance of a conventional module is relatively high compared with a structure having disk-type thyristors. The reason for this is the isolation of the thermal contact and the electrical contact, which necessitates the use of materials having low thermal conductivity compared with metals and enables only one of the main connections of the component to be cooled. Both main electrodes can be cooled in a disk-type thyristor.

A module is screwed to a cold plate or a heat sink by means of screws (typically at all four corners). Reliable contact, which conducts heat well, can thus become problematic in the centre of the base area for a module having a very large area and can change during operation over time.

In the case of a module, the main connections are arranged alongside one another on the top of the module. It is thus predetermined that a current loop, and hence an inductance, will be produced for the DC voltage connection.

In German Offenlegungsschrift 39 37 045, by R. Bayerer et al. and mentioned in the introduction, an attempt is therefore made to reduce the stray inductance and to specify a geometry which is suitable for a larger number of power transistors. For this purpose, the three main connection lines comprise wide strips, which are arranged at a small spacing from one another and form a connection stripline on account of their geometric arrangement. The lines which are routed vertically to the module base require the connection technique to be relatively complicated and make it more difficult to achieve adequate electrical insulation between one another, in particular if the inductance is to be low.

On the other hand, in German Offelegungsschrift 41 03 486 A1 by H. J. Krokiszinksi et al., an attempt is made to improve the dissipation of heat by cooling a module from both sides. However, the disadvantage of doing this is that the cooling medium flushes round the DC voltage connections as well and consequently has to be electrically insulating (for example deionized water). In addition, the DC voltage connections also form a conductor loop.

SUMMARY OF THE INVENTION

Accordingly, one object of the invention is to provide a novel power semiconductor module, which is suitable for very high powers and in the case of which the abovementioned problems are solved.

This object is achieved, in the case of a power semiconductor module of the type mentioned in the introduction, by means of the features of the first claim.

It is the core of the invention, therefore, that power semiconductor assemblies are provided on both sides of a heat sink and that said assemblies are made contact with by means of a low-inductance contact laminate stack.

The characteristic of a preferred exemplary embodiment is that the power semiconductor assemblies form one half of a half-bridge module on each side of the heat sink. The power semiconductor assemblies preferably comprise a substrate, to which there is fixed at least one power semiconductor switch having an antiparallel diode. It is advantageous for a cooling liquid to flow through the heat sink for the whole arrangement to be integrated in a protective casing.

Further exemplary embodiments emerge from the corresponding subclaims.

The advantage of the structure according to the invention is in particular that the module is adequately cooled, since assemblies are fitted on both sides of the heat sink and the assemblies are mounted directly on the heat sink. In this way, in comparison with known modules, the heat transfer from the module to the cooler is avoided.

The use of plates for contact-making, which plates additionally necessitate no diversion of the current on the DC voltage side, enables the inductance to be kept minimal. A large number of components having a small area can thus be connected in parallel, without any problems, even inside the module or assembly.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
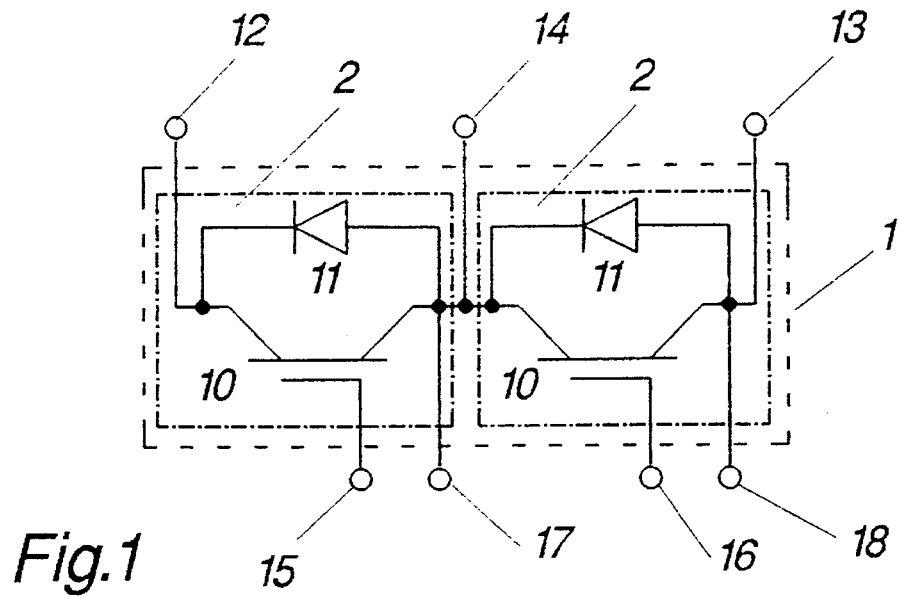
FIG. 1 shows the circuit arrangement of a half-bridge.

The reference numerals used in the drawing and their meaning are summarized in the list of designations.

DESCRIPTION OF THE PREFERRED EMBODIMENTS

One of the main applications of switchable high power components is for invertor circuits for producing AC voltage from a DC voltage. For this application, two switches and associated diodes are needed in each case for each phase. This so-called half-bridge represents the smallest logical module for an invertor circuit. Referring now to the drawings, wherein like reference numerals designate identical or corresponding parts throughout the several views, such a half-bridge is illustrated in FIG. 1.

For very high powers, until now it has been possible for half-bridge to be composed of only two individual switching modules, since the integration of the entire function in only one module would lead to a module having a very large area, which is not possible because of the limitations explained above.

Therefore, the subject matter of the invention is a half-bridge module which is suitable for very high powers. Such a module is illustrated in section in FIG. 2. It comprises a heat sink (3), which has cooling channels (7) running through it and has connections (6) for a cooling medium (for example water with an antifreeze additive). Substrates (8) are fitted on both sides of the heat sink (3). The substrates (8) comprise an electrically insulating, but nevertheless readily thermally conductive, material such as, for example, aluminum oxide, aluminum nitride or beryllium oxide. Depending on the material of the heat sink, these substrates are either soldered on (for example DCB aluminum oxide ceramic on copper) or bonded on (for example aluminum nitride ceramic on aluminum). Other joining techniques, such as plasma spraying, are also conceivable.

Figure 3:
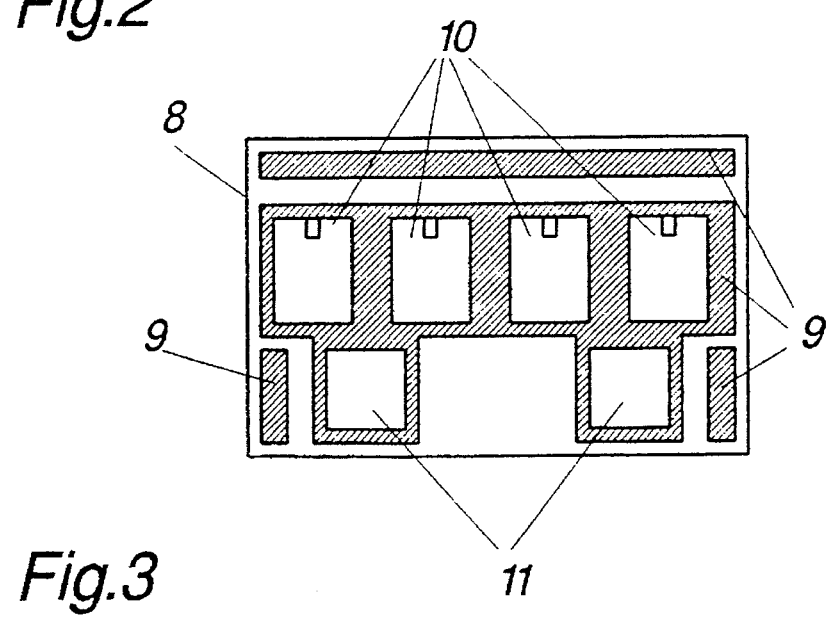
FIG. 3 shows a plan view of a power semiconductor assembly.

The individual components (for example IGBTs and diodes) are already respectively mounted, connected to one another and given a preliminary testing beforehand on the top of the substrate (8). A plan view of such a populated substrate (8) is illustrated in FIG. 3.

In an implemented exemplary embodiment, the mounted components of each substrate carry out the function of a power semiconductor switch (10) having a reverse-connected parallel diode (11). For their part, the power semiconductor switch (10) and the diode (11) can be composed of a plurality of discrete components. A populated substrate (8) generally forms a power semiconductor assembly (2) having, in principle, any desired function.

These power semiconductor assemblies (2) are now made contact with by means of suitably shaped, electrically conductive contact laminates (4). The laminates (4) are preferably composed of the same material or a material whose thermal expansion coefficient is matched to the heat sink (3). Insulating plates, not shown, are inserted between the individual laminates (4). The contact laminates (4) and the insulating plates are joined (for example bonded) to form a stack and are mechanically joined to the heat sink (3).

These laminate stacks serve, then, on both sides of the heat sinks (3) for the low-inductance joining of the individual substrates (8). The substrates are joined to the respective laminate stack with the aid of bonded or soldered joints (depending on the material of the laminates).

In the constructed exemplary embodiment, the substrates (8) on each side of the heat sink (3) represented the individual switch unit mentioned. Consequently, each side of the heat sink (3) comprised a "quarter-bridge" and the entire module (1) represented a half-bridge. As can be seen in FIG. 1, such a half-bridge has a positive connection (12), a negative connection (13) and an AC voltage connection (14). The switches (10) are turned on and off via a control connection (15, 16). For the monitoring of faults, a measuring connection (17, 18) can additionally be provided in each case. Consequently, the contact laminate stack for making contact with such a half-bridge module (1) comprises the corresponding number of contact laminates (4).

Figure 2:
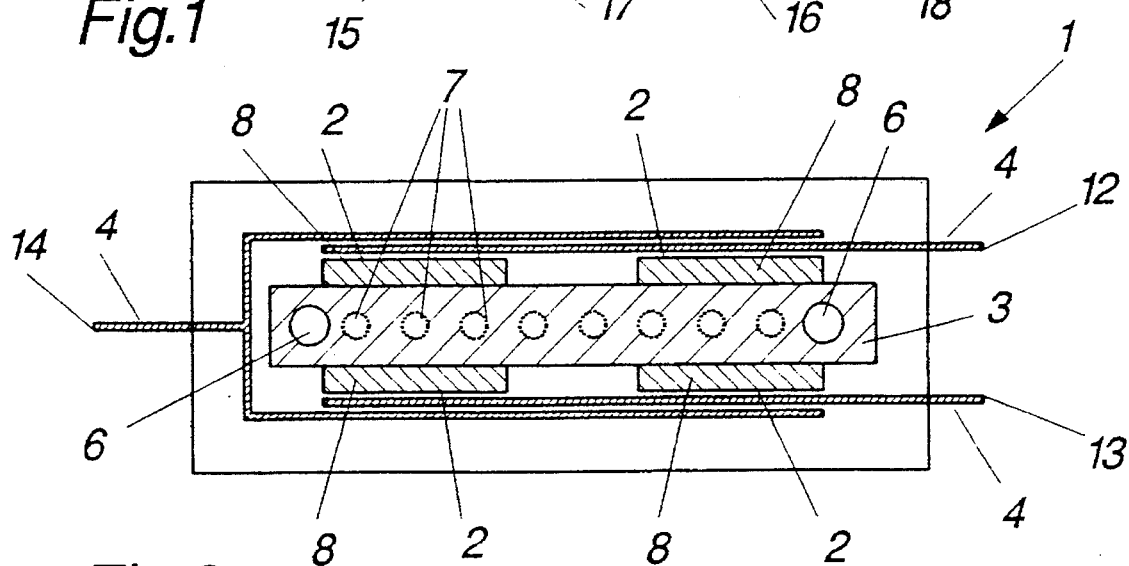
FIG. 2 shows a section through a power semiconductor module according to the invention.

The contact laminates (4) for the main connections (positive, negative and AC connection) are preferably arranged as shown in FIG. 2. The DC voltage connections (12 and 13) are brought up from the one side and the AC voltage connection (14) is brought up from the other side. Said AC voltage connection at the same time forms the connection between the quarter-bridges arranged on different sides of the heat sink (3).

Either conductor tracks (9) are fitted to the substrates (8) for the components (10 and 11) to make contact with the contact laminates (4), or the components are connected directly to the contact laminates (4). In the case of the implemented module, the connection of the cathode of the diode (11) to the connection, corresponding to an anode, of the power semiconductor switch (10) was produced directly by soldering the bottoms of the two components onto the substrates.

Finally, the module (1) produced in this way is protected against external influences by providing it with a casing (5) and sealing it, for example, with a silicone gel.

Since the two DC voltage connections (12, 13) are located above one another and not alongside one another, as in the case of conventional modules, no current loop and hence no additional inductance are produced. If the DC voltage supply is likewise implemented in the form of plates lying one above the other, as would correspond, incidentally, to today's prior art, then the module can be connected optimally by means of screw connections, but preferably by means of plug connections. The exemplary embodiment shown is based on a plug connection on the DC side. The centre web of insulating material guides the plug (for example wedge-shaped) and at the same time ensures that the necessary creepage paths are maintained.

Such a module (1) now satisfies all the requirements placed on a half-bridge module or generally on a power semiconductor module on very high power:

Adequate cooling: compared with modules according to the prior art, the heat transfer from the module to the cooling device is avoided since the components are mounted directly on a heat sink 93) in an electrically insulated manner. The thermal resistance, calculated for the implemented module and experimentally confirmed, between the barrier layer and the cooling medium is lower by approximately a factor of 2 than the value which can be achieved nowadays for conventional modules. This value is thus also lower than that of commercially available disk-type thyristors.

Low-inductance structure: the use of plates, which additionally require no diversion of the current on the DC voltage side (the inductance is critical there), enables the inductance to be kept to a minimum. In this way, a number of components having a small area can also be connected in parallel without any problems.

Physical size, resistance to temperature change: the fact that the heat sink is populated from both sides permits a minimum .physical size and optimum utilization of the cooling area made available. Avoiding large contact areas (small substrate, typically 10 cm$^2$) and carefully coordinating the materials used for the cooling device, joining technique and plate stack ensure that the forces occurring on account of the different thermal expansion coefficients are minimal. An excellent resistance to load changes is achieved thereby.

Insulation, creepage paths: the proposed design enables materials, which are insulating in a manner corresponding to the applicable standards and have sufficient thickness and dimensioning to be installed in such a manner that live contacts are at a sufficient distance from the heat sink and the control and measuring connections. This does not necessitate any compromise of the properties which are otherwise required of the half-bridge module.

Mechanical and electrical connection to the circuit: since the cooling device is already incorporated in the module, the module can be installed either horizontally or vertically. It does not have to follow the predetermined geometry of a holding and/or cold plate. It is advantageous to fix the module mechanically in guide rails, in which the module is held and then locks home in an end position.

Of course, the explained structure of a power semiconductor module is not restricted only to half-bridge circuit arrangements, rather it is used advantageously, too, for other functions.

Obviously, numerous modifications and variations of the present invention are possible in the light of the above teachings. It is therefore to be understood that within the scope of the appended claims, the invention may be practised otherwise than as specifically described herein.

What is claimed as new and desired to be secured by Letters Patent of the United States is:

1. A power semiconductor module comprising:
   a heat sink having opposed first and second sides;
   at least one power semiconductor assembly mounted on each of said first and second sides of said heat sink; and
   a plurality of electrically conductive contact laminates extending parallel to the heat sink stacked on top of the power semiconductor assemblies; and
   wherein each of the power semiconductor assemblies comprises at least one power semiconductor switch, in particular an IGBT, having a reverse-connected parallel diode connected across said switch, which are fitted to a substrate made of an electrically insulating and thermally conductive material selected from the group consisting of aluminum oxide, aluminum nitride and beryllium oxide.

2. The power semiconductor module as claimed in claim 1, wherein
   cathode connections of the diodes of the power semiconductor assemblies, mounted on the first side of the heat sink, are connected to a positive connection of a DC voltage source via a corresponding contact laminate;
   anode connections of the diodes of the power semiconductor assemblies, mounted on the second side of the heat sink, are connected to a negative connection of the DC voltage source via a further contact laminate; and
   anode connections of the diodes mounted on the first side of the heat sink and cathode connections of diodes mounted on the second side of the heat sink are connected to an AC voltage connection via a further common contact laminate.

3. The power semiconductor module as claimed in claim 2, wherein
   conductor tracks for the connections of the power semiconductor switches and the diodes are provided on the substrate;
   the cathode connections of the diodes and the connections, corresponding to an anode, of the power semiconductor switches are fitted directly onto the substrate.

4. The power semiconductor module as claimed in claim 3, wherein anode connections of the diodes, control connections, measuring connections, and connections to cathodes of the power semiconductor switches are connected to further conductor tracks which are connected to corresponding contact laminates.

5. The power semiconductor module as claimed in claim 3, wherein anode connections of the diodes, control connections, measuring connections, and connections to cathodes of the power semiconductor switches are connected directly to corresponding contact laminates.

6. The power semiconductor module as claimed in claim 1, wherein a cooling liquid flows through the heat sink and corresponding cooling liquid connections and cooling channels are provided in the heat sink.

7. The power semiconductor module as claimed in claim 1, wherein the contact laminates are composed of a material which has a thermal expansion coefficient matched to that of the heat sink.

8. The power semiconductor module as claimed in claim 1, wherein the heat sink with the power semiconductor assemblies and the contact laminates is surrounded by a protective casing, the contact laminates being routed as module connections out of the casing.

9. The power semiconductor module as claimed in claim 1, wherein insulating plates are inserted between the contact laminates.

10. The power semiconductor module as claimed in claim 1, wherein a cooling liquid flows through the heat sink and corresponding cooling liquid connections and cooling channels are provided in the heat sink.

11. The power semiconductor module as claimed in claim 2, wherein a cooling liquid flows through the heat sink and corresponding cooling liquid connections and cooling channels are provided in the heat sink.

12. The power semiconductor module as claimed in claim 3, wherein a cooling liquid flows through the heat sink and corresponding cooling liquid connections and cooling channels are provided in the heat sink.

13. The power semiconductor module as claimed in claim 4, wherein a cooling liquid flows through the heat sink and corresponding cooling liquid connections and cooling channels are provided in the heat sink.

14. The power semiconductor module as claimed in claim 5, wherein a cooling liquid flows through the heat sink and corresponding cooling liquid connections and cooling channels are provided in the heat sink.

15. The power semiconductor module as claimed in claim 1, wherein the contact laminates are composed of a material which has a thermal expansion coefficient matched to that of the heat sink.

16. The power semiconductor module as claimed in claim 2, wherein the contact laminates are composed of a material which has a thermal expansion coefficient matched to that of the heat sink.

17. The power semiconductor module as claimed in claim 3, wherein the contact laminates are composed of a material which has a thermal expansion coefficient matched to that of the heat sink.

18. The power semiconductor module as claimed in claim 4, wherein the contact laminates are composed of a material which has a thermal expansion coefficient matched to that of the heat sink.

19. The power semiconductor module as claimed in claim 5, wherein the contact laminates are composed of a material which has a thermal expansion coefficient matched to that of the heat sink.

* * * * *